United States Patent [19]

Ikushima et al.

[11] 4,028,646
[45] June 7, 1977

[54] ELASTIC SURFACE WAVE DEVICES AND METHOD FOR MAKING THE SAME

[75] Inventors: Hiroshi Ikushima, Katano; Yasuo Nakajima, Osaka; Kitokazu Hagiwara, Hirakata; Takashi Nagata, Ikeda, all of Japan

[73] Assignee: Matsushita Electric Industrial Co., Ltd., Kadoma, Japan

[22] Filed: Dec. 29, 1975

[21] Appl. No.: 645,288

[30] Foreign Application Priority Data

Dec. 30, 1974 Japan .................................. 50-1021
Mar. 20, 1975 Japan .................................. 50-34106

[52] U.S. Cl. .................................. 333/72; 310/8.9; 310/9.8
[51] Int. Cl.² .................... H03H 9/26; H03H 9/30; H03H 9/10; H01L 41/22
[58] Field of Search ............ 333/72, 30 R; 310/8.1, 310/8.2, 8.9, 9.1, 9.7, 9.8, 8.3

[56] References Cited

UNITED STATES PATENTS

3,872,331  3/1975  Falco ........................... 333/30 R X
3,885,173  5/1975  Lee ................................. 310/9.4

Primary Examiner—Alfred E. Smith
Assistant Examiner—Marvin Nussbaum
Attorney, Agent, or Firm—Wenderoth, Lind & Ponack

[57] ABSTRACT

This invention provides a surface elastic wave device constituted by a unitary body of a piezoelectric plate having a pair of transducers thereon, which unitary body is embedded in a casing, and wherein the wave propagation of a surface elastic wave generated on the surface of the piezoelectric plate during excitation of the device is prevented from being transferred to the casing by a thin film inserted between the casing and the wave propagation surface of the piezoelectric plate or by using as the casing a roll of flexible sheet which has the same function of wave propagation prevention as that of the thin film. This device is advantageous because it has a low spurious signal level without incrementing insertion loss, is easy to manufacture and is inexpensive. This invention also provides an effective method of making the device.

24 Claims, 17 Drawing Figures

ELASTIC SURFACE WAVE DEVICES AND METHOD FOR MAKING THE SAME

This invention relates to a surface elastic wave device and a method of making the same.

A known surface elastic wave element comprises a piezoelectric plate having a transmitting interdigital transducer and a receiving transducer attached on a major surface thereof. Each of the transducers comprises a pair of electrodes (usually comb-shaped) facing each other. An electric signal applied to the transmitting transducer is converted thereat to a surface elastic wave (acoustic wave) and is transferred to the receiving transducer along a wave propagation surface of the piezoelectric plate, the wave propagation surface being known to be defined by the transmitting and receiving transducers. As some examples of such surface elastic waves, a Rayleigh wave or pseudo Rayleigh wave (both of which will be simply called a p.R. wave hereinafter) and a Bleustein-Glyaev wave (which will be simply called a. B.G. wave hereinafter) are known. Two pairs of electrical leads are used for applying an electric signal to the transmitting transducer and picking up an electric signal from the receiving transducer, one pair of the electrical leads are respectively being connected to the pair of electrodes of the transmitting transducer and the other pair of the electrical leads respectively being connected to the pair of the electrodes of the receiving transducer.

Generally, an acoustic wave absorber is provided on peripheral portions of the piezoelectric plate, which portions do not include the wave propagation surface, for suppressing undesired (spurious) signals. For actual use, the surface elastic wave element is usually required to be packed in a package in the same manner as other general electronic components or devices. The surface elastic wave device thus packed is called a surface elastic wave device, which is the starting point of this invention.

Conventionally, it has been believed that no mechanical load should be applied to the wave propagation surface of the piezoelectric plate. Thus, a conventional surface elastic wave device is composed of a casing having a chamber therein in which a surface elastic wave element comprising a piezoelectric plate having a pair of transducers attached thereon and two pairs of electrical leads is mounted in a manner so as to leave an air space over the wave propagation surface of the piezoelectric plate to make the wave propagation surface a free surface. Further, when it is desired to make all of the electrical leads protrude from the casing at the same side of the casing, the above-described air space in the chamber is required to be relatively large because the electrical leads are required to be out of contact with the wave propagation surface on the piezoelectric plate. Therefore, such a conventional surface elastic wave device is large in size and troublesome to manufacture and is expensive. Further, the conventional device suffers from large spurious signals and/or large insertion losses.

Accordingly, it is an object of this invention to provide a surface elastic wave device which is small in size and insertion loss, which has a low spurious signal level and is easy to manufacture and is inexpensive.

This object is achieved according to this invention by providing a surface elastic wave device comprising a resin casing having embedded therein a unitary body comprising: a piezoelectric plate; a transmitting interdigital transducer and a receiving interdigital transducer attached on one major surface of the piezoelectric plate, each transducer comprising a pair of electrodes facing each other, a wave propagation surface for a surface elastic wave being thereby defined on the major surface of the piezoelectric plate between the transducers; a thin film mounted on the wave propagation surface and in contact with both of the transducers for preventing the surface elastic wave from being transferred from the wave propagation surface to the resin casing; and two pairs of electrical leads, one pair of which are respectively connected to the pair of electrodes of the transmitting transducer and the other pair of which are respectively connected to the pair of electrodes of the receiving transducer, all of the electrical leads being out of contact with the wave propagation surface.

It is another object of this invention to provide a method of making such a surface elastic wave device.

This object is achieved according to this invention by providing a method comprising forming a unitary body by: attaching a transmitting interdigital transducer and a receiving interdigital transducer on one major surface of a piezoelectric plate, each transducer comprising a pair of electrodes facing each other, a wave propagation surface for a surface elastic wave being thereby defined on the major surface of the piezoelectric plate between the transducers; mounting a thin film on the wave propagation surface, which film is in contact with both of the transducers for covering the wave propagation surface; and attaching two pairs of electrical leads to the transducers in a manner such that one pair of the electrical leads are respectively connected to the pair of electrodes of the transmitting transducer and the other pair of the electrical leads are respectively connected to the pair of electrodes of the receiving transducer, and all of the electrical leads are positioned out of contact with the wave propagation surface, the method further comprising covering the unitary body with a molten resin and hardening the molten resin as a casing for the unitary body.

According to this invention, the surface elastic wave device is operable with any surface elastic wave such as a p.R. wave and a B.G. wave. The piezoelectric plate can have a dielectric plate attached thereto at a surface of the piezoelectric plate opposite to the major surface of the piezoelectric plate. The thin film can have an adhesive tape adhered thereto and sandwiched between the casing and the thin film. The resin casing can be replaced by a roll of flexible sheet wound around the unitary body. Further, when the roll of flexible sheet is used as the casing, the thin film can be omitted if the flexible sheet has the same properties that the thin film is required to have. The flexible sheet can have an adhesive material coated on one surface thereof. Further, the flexible sheet can have an electrically conductive layer attached on one surface thereof opposite to the surface thereof which is in contact with the transducers or the thin film.

Other objects, features and advantages of this invention will become apparent from the following description taken together with the accompanying drawings, in which:

FIG. 1(b) is a cross-sectional view of the surface elastic wave device of FIG. 1(a) seen from a direction perpendicular to that from which FIG. 1(a) is seen;

FIG. 2(b) is a cross-sectional view of the surface elastic wave device of FIG. 2(a) seen from a direction perpendicular to that from which FIG. 2(a) is seen;

FIG. 3(b) is a cross-sectional view of the surface elastic wave device of FIG. 3(a) seen from a direction perpendicular to that from which FIG. 3(a) is seen;

FIG. 4(b) is a cross-sectional view of the surface elastic wave device of FIG. 4(a) seen from a direction perpendicular to that from which FIG. 4(a) is seen;

FIG. 5(b) is a cross-sectional view of the surface elastic wave device of FIG. 5(a) seen from a direction perpendicular to that from which FIG. 5(a) is seen;

FIG. 6(a) is a cross-sectional view of the main portion of another example of a surface elastic wave device according to this invention;

FIG. 6(b) is a cross-sectional view of the surface elastic wave device of FIG. 6(a) seen from a direction perpendicular to that from which FIG. 6(a) is seen;

FIG. 7(b) is a cross-sectional view of the surface elastic wave device of FIG. 7(a) seen from a direction perpendicular to that from which FIG. 7(a) is seen;

FIG. 8(b) is a cross-sectional view of the surface elastic wave device of FIG. 8(a) seen from a direction perpendicular to that from which FIG. 8(a) is seen.

Figure 1A:
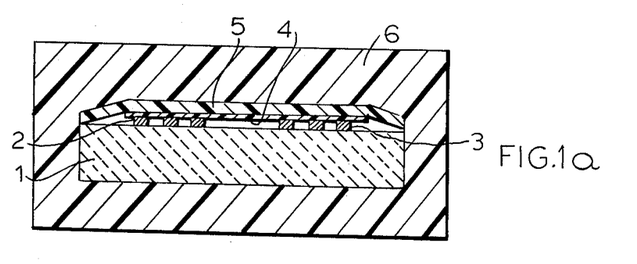
FIG. 1(a) is a cross-sectional view of the main portion of an example of a surface elastic wave device according to this invention.
Figure 1B:
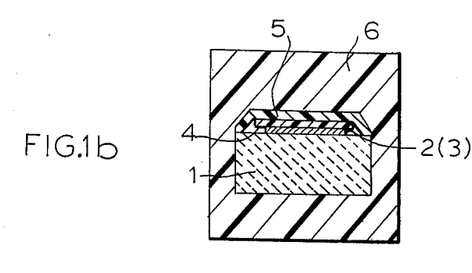

FIG. 1(a) shows a cross-sectional view of an example of a surface elastic wave device according to this invention seen from a direction perpendicular to the length of electrode branches of a transmitting interdigital transducer 2 and a receiving interdigital transducer 3. (In each of FIG. 2(a), 3(a), 4(a), 5(a), 6(a), 7(a) and 8(a) also, the direction from which the device is seen is similar to that in the case of FIG. 1(a) ). Referring to FIG. 1(a) and FIG. 1(b), the transducers 2 and 3 are attached on one major surface of a piezoelectric plate 1. Each transducer comprises a pair of electrodes facing each other. Each electrode comprises electrode branches, and each of reference numerals 2 and 3 shows cross-sections of the electrode branches of one electrode in each transducer. When an electric signal is applied to the transmitting transducer 2 (between the pair of electrodes thereof), the electric signal is converted to an acoustic wave at the surface of the piezoelectric plate at the transmitting transducer and propagates as a surface elastic wave to the receiving transducer. The surface of the piezoelectric plate on which the surface elastic wave propagates from the transmitting transducer to the receiving transducer is a wave propagation surface. A thin film 4 is adhered to an adhesive tape 5, and mounted over the wave propagation surface of the piezoelectric plate, so that the thin film 4 is in contact with both of the transducers, and extends so as to cover the wave propagation surface of the piezoelectric plate 1. The unitary body of the elements 1, 2, 3, 4 and 5 is embedded in a resin casing 6 (package) as shown.

A known piezoelectric plate (single crystal, ceramic, film) can be used for the piezoelectric plate 1, known transducers can be used for the transducers 2 and 3, and known adhesive tape can be used for the adhesive tape 5. Known methods of embedding a body in a resin can be used for embedding the unitary body in the resin casing 6 (i.e. covering the unitary body with the resin casing 6). For example, the unitary body can be embedded by covering the unitary body with a molten resin (e.g. heated heat-hardenable resin) and hardening the molten resin (e.g. cooling it). When a piezoelectric film is used for the piezoelectric plate 1, usually a supporting base can be used for supporting the piezoelectric film, and in this case, the transducers can be sandwiched between the supporting base and the piezoelectric film, to form a so-called sandwich structure. In this case, the combination of the adhesive tape 5 and the thin film 4 adhered to the tape 5 may be placed on the rear side (usually the electrically grounded side) of the transducers 2 and 3, which arrangement can be applied to any similar examples of surface elastic wave devices of this invention described later which use a piezoelectric film for the piezoelectric plate.

The function of the thin film 4 is to prevent surface elastic waves which are produced from being transferred from the wave propagation surface of the piezoelectric plate 1 to the resin casing 6 (through the adhesive tape 5 in this case), and the thin film 4 suppresses spurious signals (ripples in a pass band in filter characteristics and spurious signals due presumably to a bulk wave) in the signals picked up by the receiving transducer without increasing the insertion loss of the input signals applied to the transmitting transducer. If the unitary body is directed immersed in a molten resin without using the thin film and the resin is cooled so that it is in direct contact with the wave propagation surface of the piezoelectric plate, the insertion loss of the input signals becomes undesirably large. For this function of the thin film 4, it is preferable that the thin film 4 be a non-adherent material, which does not adhere to the wave propagation surface. Preferable materials for the thin film 4 are plastic films such as a cellophane film. There is no critical thickness limitation for the thin film 4. Of course, too small a thickness thereof is not desirable. Since the displacement amplitude of the surface of the piezoelectric plate in the thickness direction of the piezoelectric plate is usually less than about 10 microns, and the thickness of the thin film 4 should preferably not be less than the displacement amplitude, the thickness of the thin film 4 is preferably larger than about 10 microns. When the thin film 4 is required to be exposed to a high temperature e.g. due to the temperature of the molten resin in forming the casing 6, the thin film 4 is required to be able to withstand such high temperature.

The use of the thin film 4 is advantageous because it makes it possible to embed the unitary body of the surface elastic wave element in a resin casing in which substantially no air space is required, so that it is easy to manufacture the surface elastic wave device, and the device can be inexpensive, and moreover, the surface elastic wave device thus made can suppress the spurious signals without increasing the insertion loss.

Figure 2A:
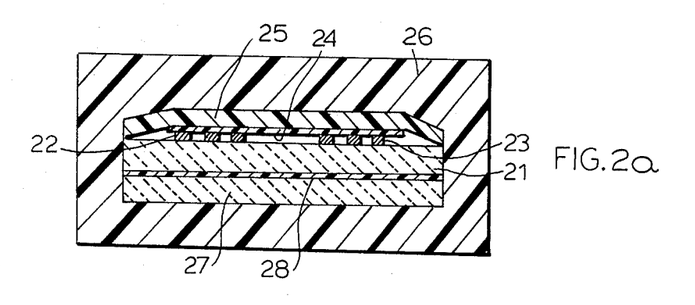
FIG. 2(a) is a cross-sectional view of the main portion of another example of a surface elastic wave device according to this invention.
Figure 2B:
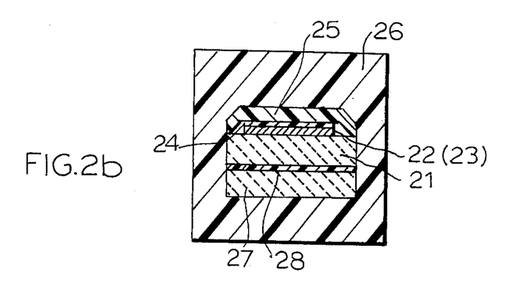

FIGS. 2(a) and 2(b) show another example of a surface elastic wave device of this invention. Elements 21 to 26 shown therein are equivalent to the elements 1 to 6, respectively, shown in FIG. 1(a) and 1(b). An only difference between FIG. 1(a) (1(b)) and FIG. 2(a) (2(b)) is that a dielectric plate 27 having a dielectric constant substantially lower than that of the piezoelectric plate 21 is attached to the piezoelectric plate 21, at a surface of the piezoelectric plate opposite to the major surface of the piezoelectric plate having the transducers 22 and 23 attached thereon, by using an adhesive material layer 28.

The function of the dielectric plate 27 is to further decrease unwanted spurious signals in the desired signals. It is not necessary that the dielectric plate 27 function to transmit and receive a surface elastic wave thereon. The thickness of the adhesive material layer 28 is not critical, but the adhesive material layer 28 is preferably electrically non-conductive. Further, when a thin piezoelectric film is used for the piezoelectric plate 21, a supporting base such as a glass, quartz and $SiO_2$-Si is used for supporting the thin piezoelectric film, and thus in such case, the adhesive layer 28 is sandwiched between the dielectric plate 27 and the supporting base.

Figure 3A:
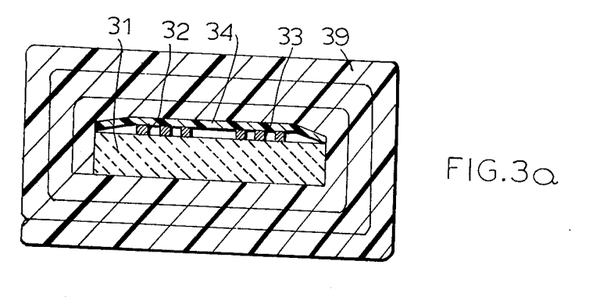
FIG. 3(a) is a cross-sectional view of the main portion of still another example of the surface elastic wave device according to this invention.
Figure 3B:
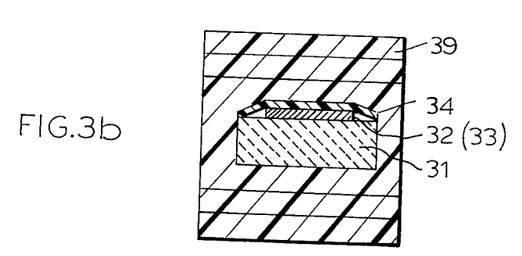

FIGS. 3(a) and 3(b) show another example of a surface elastic wave device according to this invention. The elements 31 to 34 are equivalent to the elements 1 to 4, respectively, shown in FIGS. 1(a) (1(b)). A flexible sheet 39, which constitutes a casing, is wound around the unitary body made up of the elements 31 to 34 so as to wrap the unitary body. Preferable materials for the flexible sheet 39 are plastic sheets such as an anti-moisture cellophane film and a polystyrene film. A part of or the whole surface of the flexible sheet can be coated with an adhesive material for strengthening the wound roll thereof which forms a casing.

Figure 4A:
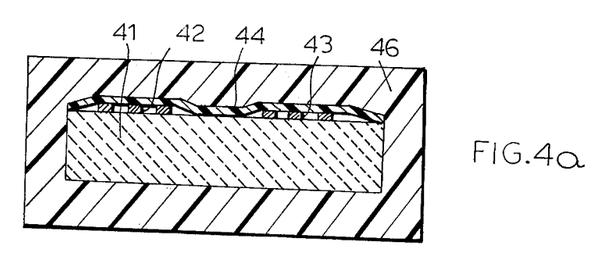
FIG. 4(a) is a cross-sectional view of the main portion of yet another example of a surface elastic wave device according to this invention.
Figure 4B:
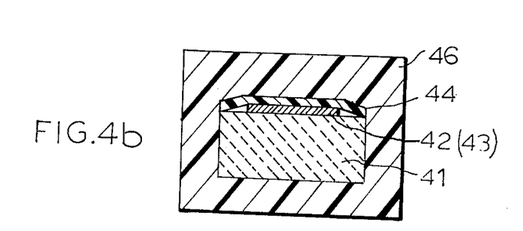

FIGS. 4(a) and 4(b) show another example of a surface elastic wave device according to this invention. This example is similar to that of FIGS. 1(a) (1(b)), and the only difference is that the adhesive tape 5 used in FIGS. 1(a) and (1(b)) is not used here. The thin film 44 is attached over the wave propagation surface (including the surfaces of the transducers 42 and 43) of the piezoelectric plate 41 e.g. by using a well-known vacuum-sealing method, and then the unitary body made up of the elements 41 to 44 is embedded in the resin casing 46.

Figure 5A:
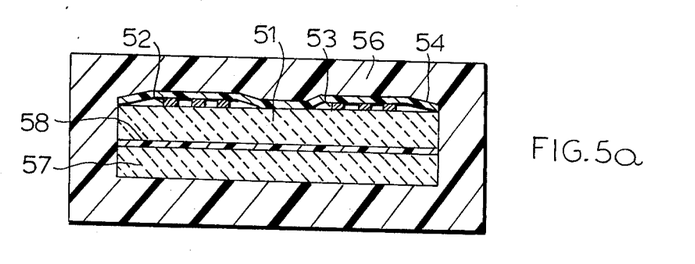
FIG. 5(a) is a cross-sectional view of the main portion of still another example of a surface elastic wave device according to this invention.
Figures 5B, 6A:
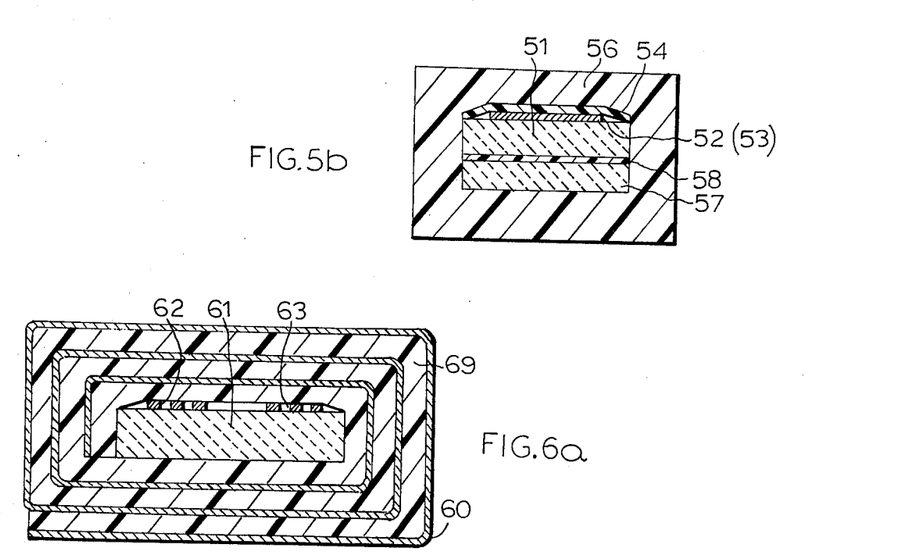

FIGS. 5(a) and 5(b) show another example of a surface elastic wave device according to this invention. This example is similar to that of FIGS. 2(a) and (2(b)), and the only difference is that the adhesive tape 25 used in FIGS. 2(a) and (2(b)) is not used in FIGS. 5(a) and (5(b)). The elements 51, 52, 53, 54, 56, 57 and 58 are equivalent to the elements 21, 22, 23, 24, 26, 27 and 28, respectively, shown in FIGS. 2(a) and (2(b)). The thin film 54 is attached over the wave propagation surface (including the surfaces of the transducers 52 and 53) of the piezoelectric plate 51 e.g. by using a well-known vacuum-sealing method, and the unitary body make up of the elements 51 to 54 and 57 and 38 is embedded in the resin casing 56.

Figure 6B:
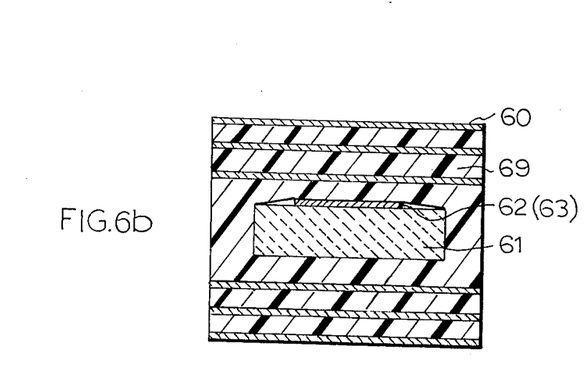

FIGS. 6(a) and 6(b) show another example of a surface elastic wave device according to this invention. This example is similar to that of FIG. 3(a) and (3(b)), and the differences are that the thin film 34 is not used here, but instead a flexible sheet 69 made of the same material as that of the thin film 34 is used, and preferably has an electrically conductive layer 60 attached to one surface thereof opposite to the surface thereof facing the transducers 62 and 63. The elements 61 to 63 and 69 are equivalent to the elements 31 to 33 and 39, respectively, shown in FIG. 3(a) and (3(b)). Preferable materials for the electrically conductive layer 60 are metal foils, vacuum-deposited metal films and electrically conductive resin films. The function of the electrically conductive layer 60 is to suppress the so-called direct wave (which is one kind of undesired spurious signal and is caused by a phenomenon that an electric signal applied to the transmitting transducer is transferred to the receiving transducer without being converted to a surface elastic wave).

Figure 7A:
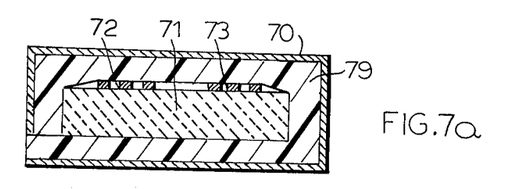
FIG. 7(a) is a cross-sectional view of the main portion of still another example of a surface elastic wave device according to this invention.
Figure 7B:
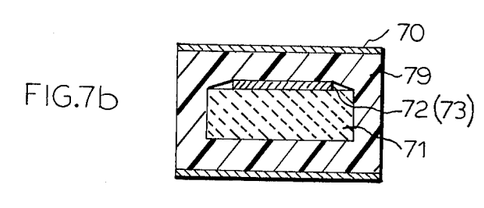

FIGS. 7(a) and 7(b) show an example of a surface elastic wave device according to this invention, which is similar to that of FIGS. 6(a) and (6(b)), and in which a single turn roll of a thick flexible sheet 79 is used as a casing rather than a multiple turn roll of a thin flexible sheet. The elements 70 to 73 and 79 are equivalent to the elements 60 to 63 and 69, respectively, shown in FIGS. 6(a) and (6(b)).

Figure 8A:
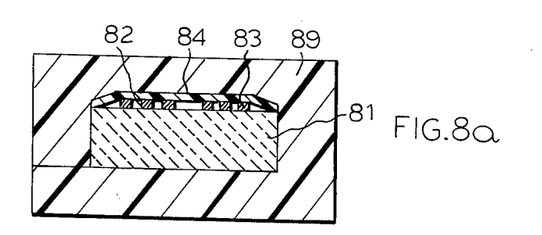
FIG. 8(a) is a cross-sectional view of the main portion of yet another example of a surface elastic wave device according to this invention.
Figure 8B:
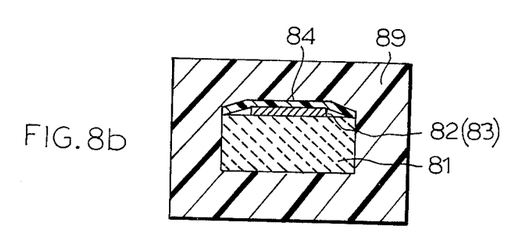

FIGS. 8(a) and 8((E)b) show an example of a surface elastic wave device according to this invention, which is similar to that of FIGS. 3(a) and (3(b)), and in which a single turn roll of a thick flexible sheet 89 is used as a casing rather than a multiple turn roll of a thin flexible sheet. The elements 81 to 84 and 89 are equivalent to the elements 31 to 34 and 39, respectively, shown in FIGS. 3(a) and (3(b)).

Figure 9:
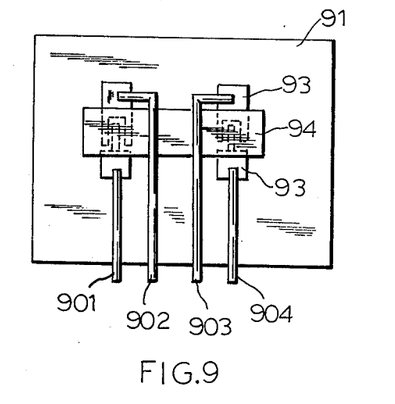
FIG. 9 is a top plan view of the main internal portion of a surface elastic wave device common to some examples of surface elastic wave devices according to this invention.

FIG. 9 shows an example of a main internal portion of a surface elastic wave device according to this invention in which a thin film is used, and shows an exemplary way of arranging two pairs of electrical leads to the transducers. Although such electrical leads are not shown in any of the examples hwereinbefore described with reference to FIGS. 1 to 8, each of the examples hereinbefore described needs two pairs of electrical leads, and the electrode lead arrangement shown in FIG. 9 or a similar electrode lead arrangement can be applied to the examples hereinbefore described.

Referring to FIG. 9, a transmitting interdigital transducer 92 and a receiving interdigital transducer 93 are attached on the major surface of a piezoelectric plate. Each transducer comprises a pair of comb-shaped electrodes facing each other, as shown. A pair of electrical leads 901 and 902 are respectively connected to the pair of electrodes of the transmitting transducer 92. Similarly, a pair of electrical leads 903 and 904 are respectively connected to the pair of electrodes of the receiving transducer 93. A thin film 94 is attached over the surface elastic wave element and extends in contact with both of the transducers 92 and 93 and covers the wave propagation surface of the piezoelectric plate 91, as shown. All of the electrical leads 901 to 904 are required to be out of contact with the wave propagation surface, and FIG. 9 shows one example of arranging the electrical leads 901 to 904 out of contact with the wave propagation surface.

FIG. 9 shows the case where all of the leads of the two pairs of electrical leads protrude from the casing at the same side of the casing (so-called in-line arrangement of electrical leads). In the case of FIG. 9, because of the presence of the thin film 94, the electrical leads 902 and 903 can be easily made to extend to the same side as that to which the electrical leads 901 and 904 extend, before embedding the unitary body in a resin casing or wrapping the unitary body in a flexible sheet. The electrical leads 902 and 903 can be positioned over the thin film 94, i.e. on the side remote from the wave propagation surface, and the unitary body can be directly covered by or embedded in a casing, without the necessity of having an air space between the unitary body and the casing. In such case, in the resultant surface elastic wave device, the electrical leads 902 and 903 extend along the interface between the thin film 94 and the casing, as can be easily understood.

In the case where a thin film such as the film 94 is not used, as in the case of FIGS. 6a and 6b, the interface between turns of the flexible sheet roll can be used as the location for the electrical leads. Similarly, even e.g. in FIGS. 3a and 3b, where a thin film is used, the electrical leads can be made to extend through and along the interface between turns of the flexible sheet roll, if desired, although it is considered to be better in many respects to use the interface between the thin film and the casing for the location of the two of the four electrical leads.

The following Examples more specifically explain the features of this invention, but are not to be construed to limit thereby the scope of this invention.

EXAMPLE 1

Surface elastic wave devices according to this invention (represented by (c) in Table 1) which is schematically shown by FIGS. 1 (a) and 1 (b) were prepared. Several structural features of each of the thus made surface elastic wave devices are shown in Table 1. A cellophane film having a thickness of 30 μ was used as the thin film 4. A commercially available adhesive tape having an adhesive coating on one side thereof was used as the adhesive tape 5. For forming the resin casing 6, the unitary body made up of the piezoelectric plate 1, transducers 2 and 3, thin film 4 and adhesive tape 5 was preliminarily heated and immersed in an epoxy resin powder, and the unitary body and the epoxy resin powder adhered on the unitary body were heated at about 150° C. For comparison. surface elastic wave devices (represented by (A) in Table 1) the same as those (c) prepared above, except that they did not have a thin film 4, an adhesive tape 5 and a casing 6, were prepared. Also, for comparison, surface elastic wave devices (represented by (B) in Table 1) the same as those (C) prepared above, except that they did not have a thin film 4 and an adhesive tape 5, were prepared. A known piezoelectric ceramic the composition of which can be expressed by Pb $(Mg_{1/3}Nb_{2/3})_{0.063}Ti_{0.407}Zr_{0.530}O_3 + 0.5$ wt. % $MnO_2$ was used for the piezoelectric plate 1 in each case. This ceramic had $Q_M$ of about 1,100, $\epsilon_{ii}$ (dielectric constant in the direction parallel to the polarization axis) of 350, $\epsilon_1$ (dielectric constant in the direction perpendicular to the polarization axis) of 700, $k_{15}$ of about 70 %, and $k_{33}$ of 59 %. In each case, so-called normal type transducers were used for the transducers 2 and 3 for transmitting and receiving p.R. waves.

The filter characteristics of these devices were examined. In the case of the devices (A), ripples, as undesired spurious signals, of several dB were observed in a pass band the central frequency of which represents the peak of a desired signal. Also undesired pass band spectra presumably caused by bulk waves depending on the electrode pitch (distance between the electrodes of each of the transducers) were observed at a higher frequency region in the same pass band. On the other hand in the case of the devices (C) according to this invention, ripples observed, as undesired spurious signals, were less than 1 dB in the same pass band for the devices (C), and no undesired pass band spectra presumbly caused by the bulk waves were observed in the same pass band. The increment of insertion loss in the case of the device according to this invention was small in the same pass band. In the case of the devices (B), the increment of insertion loss was large. Details of the observed characteristics are shown in Table 1. In addition, it was found that similar characteristics could be obtained even by replacing the resin casing by a wax or a liquid such as an oil and water for the devices (B) and (C).

EXAMPLE 2

A surface elastic wave device according to this invention which is schematically shown by FIGS. 2(a) and 2(b) was prepared. As the piezoelectric plate 21, a piezoelectric material the same as used in Example 1 was used. The plate had a thickness of 0.5 mm, a length of 30 mm and a width of 12 mm. The plate was polarized in the width direction, and interdigital transducers the electrode pitch of which was 0.5 mm were used as the transducers 22 and 23 so as to transmit and receive B.G. waves. A phenol resin plate usually used as a base for a printed circuit board was used as the dielectric plate 27. An adhesive material mainly composed of an epoxy resin was used for the adhesive material layer 28. The thin film 24, the adhesive tape 25 and the resin casing 26 were applied in the same manner as for thin film 4, the adhesive tape 5 and the resin casing 6 in Example 1. For comparison, a surface elastic wave device the same as the thus prepared device, except that it did not have a thin film 24, an adhesive tape 25, a resin casing 26, an adhesive material layer 28 and a dielectric plate 27, was prepared. The filter characteristics of these devices were examined in the same manner as in Example 1. The ripples observed, as unwanted spurious signals, in the case of the device according to this invention (FIG. 2) were not more than 1 dB, and no undesired signal presumably caused by bulk waves was observed. Further, the insertion loss of this device was only 1 dB more than the insertion loss of the device prepared above for comparison. In the case of the device prepared above for comparison, undesired signals similar to those observed for the device (A) in Example 1 were observed.

EXAMPLE 3

A surface elastic wave device (represented by (D) in Table 2) according to this invention which is schematically shown by FIGS. 5 (a) and 5 (b) was prepared. The piezoelectric plate 51 had a thickness of 0.2 mm. Normal type transducers were used for the transducers 52 and 53, wherein the electrode pitch (½ wave length) was 20μ, for transmitting and receiving p.R. waves. The dielectric plate 57 had a thickness of 1.0 mm. The thin film 54 had a thickness of 20μ. The same materials as those used for the dielectric plate 27, adhesive material layer 28, piezoelectric plate 21, transducers 22, 23, thin film 24 and resin casing 26 were used respectively for the dielectric plate 57, adhesive material layer 58, piezoelectric plate 51, transducers 52, 53, thin film 54 and resin casing 56, respectively. For comparison, three surface elastic wave devices (represented by (A), (B) and (C) in Table 2) the same as that (D) prepared above, except that one of the three (A) did not have the adhesive material layer 58, dielectric plate 57, thin film 54 and resin casing 56, another of the three (B) did not have the thin film 54 and resin casing 56, and the last of the three (C) did not have the thin film 54, were prepared.

The filter characteristics of each of these devices were measured in a manner similar to that done in Example 1 by connecting an electrical resistance as a load resistance to the device and by applying a continuous signal as an input signal to the device. The ripples observed, as undesired spurious signals, in the case of the device (D), were less than 1 dB, and no undesired signal presumably caused by bulk waves was observed. The insertion loss of the device (D) as compared to the insertion loss of the device (A) was less than 2 dB. The ripples observed, as undesired spurious signals, in the case of the devices (A) and (B), were up to several dB. Further, undesired pass band spectra presumably caused by bulk waves were observed in these devices. The insertion losses of the devices (B) and (C) as compared to the insertion loss of the device (A) were large. Details of the observed characteristics are shown in Table 2. In addition, it was found that the observed characteristics of all of the devices prepared here did not change even by changing the thickness of the piezoelectric plate 51 to 0.5 mm, and further that the observed characteristics of the devices (C) and (D) did not change even when the resin casing was replaced by wax or a liquid such as an oil and water.

EXAMPLE 4

Surface elastic wave devices (represented by (C) in Table 3) according to this invention which are schematically shown by FIGS. 3(a) and 3(b) were prepared. Normal type transducers were used for the transducers 32 and 33, as in Example 1. A polystyrene film having a thickness of 50 $\mu$ was used as the flexible sheet 39, and wound as a casing on the unitary body in several turns. The same materials as used for the piezoelectric plate 1, transducers 2 and 3, and thin film 4 were used respectively for the piezoelectric plate 31, transducers 32 and 33, and the thin film 34. For comparison, surface elastic wave devices (represented by (A) and (B) in Table 3) the same as those (C) prepared above, except that the devices (A) did not have a thin film 34 and a flexible sheet casing 39, and the devices (B) did not have a thin film 34 but used an adhesive tape attached directly on the wave propagation surface of the piezoelectric plate 31 (so that the adhesive surface thereof contacted the transducers and the surface of the piezoelectric plate) instead of using a thin film 34 and a flexible sheet casing 39, were prepared. The filter characteristics of these devices were examined in the same manner as in Example 1, and the observed characteristics are shown in Table 3.

EXAMPLE 5

Surface elastic wave devices according to this invention (which are schematically shown by FIGS. 6(A) and 6(B)) the same as the devices (A) prepared in Example 4, except that they did not use a thin film 34 but had a metal foil 60 having a thickness of 20$\mu$ attached on one surface of the flexible sheet 69, as shown in FIGS. 6(a) and 6(b), were prepared. The filter characteristics of these devices were examined in the same manner as in Example 4. The characteristics similar to those of the devices (C) in Table 3 were observed with the devices prepared here. Further, undesired signals caused by direct waves (input signals in the transmitting transducer directly received by the receiving transducer, without being converted to surface elastic waves) were smaller in these devices by several to about 10 dB than those observed in the devices (A) prepared in Example 4.

As for devices which are schematically shown in FIGS. 4a and 4b, 7a and 7b, and 8a and 8b advantageous results similar to those observed in Examples 1 to 5 were also observed.

It can be easily understood from the foregoing that the p.R. waves and/or B.G. waves can be used as surface elastic waves for the devices according to this invention. It is apparent that casings for surface elastic wave elements with substantially no air space therein are possible according to this invention, and the devices of this invention can be easily manufactured. Further, it is obvious to those of ordinary skill in the art that the devices according to this invention are applicable not only as filters, but also as other functional elements such as delay lines.

Table 1

| Thickness of the piezo-electric substrate (unit : mm) | Electrode pitch : half of wave length($\lambda$) (unit : $\mu$) | Mechanical load on surface wave | Central frequency ($f_c$) (unit : MH$_z$) | Level of unwanted Signals (unit : dB) | Increment of insertion loss *2 (unit : dB) | Load resistance in circuit ($\Omega$) |
|---|---|---|---|---|---|---|
| 4.3 | | (A) | 2.2 | 2~3 | 0 | ∞ |
| ∫ | 500 | (B) | 2.2 | ≤1 | 10~12 | ∞ |
| 4.4 | | (C) | 2.2 | ≤1 | ≤1 | ∞ |
| | | (A) | 10.9 | 3~4 | 0 | ∞ |
| 3.0 | 100 | (B) | 10.9 | ≤1 | 12~20 | ∞ |
| | | (C) | 10.9 | <1 | 1~2 | ∞ |
| | | (A) | 17.5 | 4~5 | 0 | ∞ |
| 3.0 | 60 | (B) | 17.5 | ≤1 | 12~20 | ∞ |
| | | (C) | 17.5 | <1 | 1~2 | ∞ |
| 0.2 | | (A) | 57*¹ | 2~3 | 0 | 50 |
| ∫ | 20 | (B) | 57 | ≤1 | 8~16 | 50 |

Table 1-continued

Filter Characteristics of Surface Elastic Wave Devices (1)

| Thickness of the piezo-electric substrate (unit : mm) | Electrode pitch : half of wave length($\lambda$) (unit : $\mu$) | Mechanical load on surface wave | Central frequency ($f_c$) (unit : MH$_z$) | Level of unwanted Signals (unit : dB) | Increment of insertion loss *2 (unit : dB) | Load resistance in circuit ($\Omega$) |
|---|---|---|---|---|---|---|
| 0.25 | | (C) | 57 | <1 | 0~2 | 50 |

(A): Free surface
(B): Resin casing without a thin film
(C): A thin film plus a resin casing
*1: A continuous signal was used as an input signal. (In the other cases, a burst signal with $f_c$ as a carrier was used as an input signal)
*2: Voltage loss, under the shown load resistance, over the voltage loss of the device (A).

Table 2

Filter Characteristics of Surface Elastic Wave Devices (2)

| Mechanical load on surface wave | Central frequency (unit : MH$_z$) | Level of unwanted signals (unit : dB) | Increment of insertion loss* (unit : dB) |
|---|---|---|---|
| (A) | 57 | 2~3 | 0 |
| (B) | 57 | ≤2 | 3~4 |
| (C) | 57 | ≤1 | 8~16 |
| (D) | 57 | <1 | 0~2 |

(A): Free surface
(B): Free surface plus a dielectric plate
(C): Resin casing plus a dielectric plate without a thin film
(D): A thin film plus a resin casing and a dielectric plate
*Voltage loss, under the load resistance of 50$\Omega$, over the voltage loss of the device (A)

Table 3

Filter Characteristics of Surface Elastic Wave Devices (3)

| Thickness of the piezo-electric substrate (unit : mm) | Electrode Pitch (d) : half of wave length($\lambda$) | Mechanical load on surface wave | Central frequency ($f_c$) (unit : MH$_z$) | Level of unwanted signals (unit : dB) | Increment of insertion loss *3 (unit : dB) | Load resistance ($\Omega$) |
|---|---|---|---|---|---|---|
| 4.3 ∫ 4.4 | 500 | (A) | 2.2 | 2~3 | 0 | ∞ |
| | | (B) | 2.2 | ≤1 | 6~8 | ∞ |
| | | (C) | 2.2 | ≤1 | ≤1 | ∞ |
| 3.0 | 100 | (A) | 10.9 | 3~4 | 0 | ∞ |
| | | (B) | 10.9 | ≤1 | 8~16 | ∞ |
| | | (C) | 10.9 | <1 | 1~2 | ∞ |
| 3.0 | 60 | (A) | 17.5 | 4~5 | 0 | ∞ |
| | | (B) | 17.5 | ≤1 | 8~16 | ∞ |
| | | (C) | 17.5 | <1 | 1~2 | ∞ |
| 0.2 *1 ∫ 0.25 | 20 | (A) | 57 *2 | 2~3 | 0 | 50 |
| | | (B) | 57 | ≤1 | 4~12 | 50 |
| | | (C) | 57 | <1 | 0~2 | 50 |

(A): Free surface
(B): An adhesive tape directly attached to the surface of the transducers and the piezoelectric plate
(C): A thin film plus a flexible sheet casing
*1: A bakelite plate having a thickness of 1.5 mm was used as a base plate, only in the case of (A)
*2: A continuous signal was used as an input signal. (In the other cases, a burst signal with $f_c$ as a carrier was used as an input signal)
*3: Voltage loss, under the shown load resistance, over the voltage loss of the device (A).

What is claimed is:

1. A surface elastic wave device comprising a resin casing having embedded therein a unitary body comprising: a piezoelectric plate; a transmitting interdigital transducer and a receiving interdigital transducer attached on one major surface of said piezoelectric plate, each transducer comprising a pair of electrodes facing each other, a wave propagation surface for a surface elastic wave being thereby defined on said major surface of said piezoelectric plate between said transducers; a thin film coextensive with said propagation surface and in contact with both of said transducers for preventing said surface elastic wave from being transferred from said wave propagation surface to said resin casing; and two pairs of electrical leads, the leads of one pair of which are respectively connected to the electrodes of said pair of electrodes of said transmitting transducer and the leads of the other pair of which are respectively connected to the electrodes of said pair of electrodes of said receiving transducer, all of said electrical leads being out of contact with said wave propagation surface.

2. A surface elastic wave device according to claim 1, wherein said thin film is a plastic film.

3. A surface elastic wave device according to claim 1, which further comprises an adhesive tape having said thin film adhered thereto and being sandwiched between said thin film and said resin casing.

4. A surface elastic wave device according to claim 1, which further comprises a dielectric plate attached to said piezoelectric plate at a surface of said piezoelectric plate opposite to said major surface and sandwiched between said piezoelectric plate and said resin casing.

5. A surface elastic wave device according to claim 1, wherein one electrical lead of each pair of said two pairs of electrical leads extends along an interface between said thin film and said resin casing.

6. A surface elastic wave device comprising a unitary body comprising: a piezoelectric plate; a transmitting interdigital transducer and a receiving interdigital transducer attached on one major surface of said piezoelectric plate, each transducer comprising a pair of electrodes facing each other, a wave propagation surface for a surface elastic wave being thereby defined on said major surface of said piezoelectric plate between said transducers; a thin film coextensive with said wave propagation surface and in contact with both of said transducers; and two pairs of electrical leads, the leads of one pair of which are respectively connected to the electrodes of said pair of electrodes of said transmitting transducer and the leads of the other pair of which are respectively connected to the electrodes of said pair of electrodes of said receiving transducer, all of said electrical leads being out of contact with said wave propagation surface, the surface elastic wave device further comprising a flexible sheet, as a casing for said unitary body, wound around said unitary body, said thin film acting to prevent said surface elastic wave from being transferred from said wave propagation surface to said flexible sheet.

7. A surface elastic wave device according to claim 6, wherein said thin film is a plastic film.

8. A surface elastic wave device according to claim 6, wherein one electrical lead of each pair of said two pairs of electrical leads is extends along an interface between said thin film and said flexible sheet.

9. A surface elastic wave device according to claim 6, wherein said flexible sheet has an adhesive material coated on one surface thereof.

10. A surface elastic wave device according to claim 6, wherein said flexible sheet has an electrically conductive layer attached on one surface thereof.

11. A surface elastic wave device comprising a unitary body comprising: a piezoelectric plate; a transmitting interdigital transducer and a receiving interdigital transducer attached on one major surface of said piezoelectric plate, each transducer comprising a pair of electrodes facing each other, a wave propagation surface for a surface elastic wave being thereby defined on said major surface of said piezoelectric plate between said transducers; and two pairs of electrical leads, the leads of one pair of which are respectively connected to the electrodes of said pair of electrodes of said transmitting transducer and the leads of the other of which are respectively connected to the electrodes of said pair of electrodes of said receiving transducer, all of said electrical leads being out of contact with said wave propagation surface, the surface elastic wave device further comprising a flexible sheet, as a casing for said unitary body, wound around said unitary body with the innermost turn in contact with both said transducers, said flexible sheet acting to prevent said surface elastic wave from being transferred therethrough.

12. A surface elastic wave device according to claim 11, wherein said flexible sheet is made of a plastic material.

13. A surface elastic wave device according to claim 11, wherein said flexible sheet has an electrically conductive layer attached on one surface thereof opposite to the surface thereof which is in contact with said transducers.

14. A method of making a surface elastic wave device, comprising: forming a unitary body by attaching a transmitting interdigital transducer and a receiving interdigital transducer on one major surface of a piezoelectric plate, each transducer comprising a pair of electrodes facing each other, a wave propagation surface for a surface elastic wave being thereby defined on said major surface of said piezoelectric plate between said transducers; providing a thin film coextensive with said wave propagation surface and placing it over said wave propagation surface and in contact with both of said transducers for covering said wave propagation surface; and attaching two pairs of electrical leads to said transducers in a manner such that the leads of one pair of said electrical leads are respectively connected to the electrodes of said pair of electrodes of said transmitting transducer and the leads of the other pair of said electrical leads are respectively connected to the electrodes of said pair of electrodes of said receiving transducer, and all of said electrical leads are out of contact with said wave propagation surface; the method further comprising covering said unitary body with a molten resin and hardening said molten resin as a casing for said unitary body.

15. A method of making a surface elastic wave device according to claim 14, wherein said molten resin is made by heating a heat-softenable resin, and said hardening step is carried out by cooling said molten resin.

16. A method of making a surface elastic wave deive according to claim 14, wherein said thin film is a plastic film.

17. A method of making a surface elastic wave device according to claim 14, wherein said thin film providing step is carried out by preliminarily adhering said thin film on an adhesive tape, and then placing the combination of said thin film and said adhesive tape so as to cover said wave propagation surface thereby.

18. A method of making a surface elastic wave device, comprising: forming a unitary body by attaching a transmitting interdigital transducer and a receiving interdigital transducer on one major surface of a piezoelectric plate, each transducer comprising a pair of electrodes facing each other, a wave propagation surface for a surface elastic wave being thereby defined on said major surface of said piezoelectric plate between said transducers, providing a thin film coextensive with said wave propagation surface and placing it over said wave propagation surface and in contact with both of said transducers for covering said wave propagation surface; and attaching two pairs of electrical leads to said transducers in a manner such that the leads of one pair of said electrical leads are respectively connected to the electrodes of said pair of electrodes of said transmitting transducer and the leads of the other pair of said electrical leads are respectively connected to the electrodes of said pair of electrodes of said receiving transducer, and all of said electrical leads are out of contact with said wave propagation surface; the method further comprising winding a flexible sheet, as a casing for said unitary body, around said unitary body.

19. A method of making a surface elastic wave device according to claim 18, wherein said thin film is a plastic film.

20. A method of making a surface elastic wave device according to claim 18, wherein said flexible sheet has an adhesive material coated on one surface thereof.

21. A method of making a surface elastic wave device according to claim 18, wherein said flexible sheet has an electrically conductive layer attached on one surface thereof.

22. A method of making a surface elastic wave device, comprising: forming a unitary body by attaching a transmitting interdigital transducer and a receiving interdigital transducer on one major surface of a piezoelectric plate, each transducer comprising a pair of electrodes facing each other, a wave propagation surface for a surface elastic wave being thereby defined on said major surface of said piezoelectric plate between said transducers; and attaching two pairs of electrical leads to said transducers in a manner such that the leads of one pair of said electrical leads are respectively connected to the electrodes of said pair of electrodes of said transmitting transducer and the leads of the other pair of said electrical leads are respectively connected to the electrodes of said pair of electrodes of said receiving transducer, and all of said electrical leads are out of contact with said wave propagation surface; the method further comprising winding a flexible sheet, as a casing for said unitary body, around said unitary body and bringing the innermost turn into contact with said transducers.

23. A method of making a surface elastic wave device according to claim 22, wherein said flexible sheet is made of a plastic material.

24. A method of making a surface elastic wave device according to claim 22, wherein said flexible sheet has an electrically conductive layer attached on one surface thereof opposite to the surface thereof which is in contact with said transducers.

* * * * *